(12) United States Patent
Tai et al.

(10) Patent No.: US 7,779,379 B2
(45) Date of Patent: Aug. 17, 2010

(54) TEMPLATE-BASED GATEWAY MODEL ROUTING SYSTEM

(75) Inventors: Wen Cheng Tai, Taipei (TW); Chun Wen Chiang, Sinfong Township, Hsinchu County (TW); Ying Hui Wang, Puli Town (TW); Jui Chien Wang, Cyonglin Township, Hsinchu County (TW)

(73) Assignee: Springsoft USA, Inc., San Jose, CA (US)

( * ) Notice: Subject to any disclaimer, the term of this patent is extended or adjusted under 35 U.S.C. 154(b) by 304 days.

(21) Appl. No.: 11/761,166

(22) Filed: Jun. 11, 2007

(65) Prior Publication Data

US 2007/0288878 A1    Dec. 13, 2007

Related U.S. Application Data

(60) Provisional application No. 60/813,304, filed on Jun. 12, 2006.

(51) Int. Cl.
*G06F 17/50* (2006.01)
(52) U.S. Cl. .............................. 716/12; 716/13; 716/14
(58) Field of Classification Search ................. 716/8–15
See application file for complete search history.

(56) References Cited

U.S. PATENT DOCUMENTS 7,380,231 B2 *   5/2008   Zhang et al. ................... 716/12
7,392,498 B1 *   6/2008   Srinivasan et al. ............ 716/16

* cited by examiner

*Primary Examiner*—Vuthe Siek
(74) *Attorney, Agent, or Firm*—Chernoff, Vilhauer, McClung & Stenzel LLP

(57) ABSTRACT

A routing tool allows a user to create a set of routing templates, each specifying the shape of a routing corridor and identifying the corridor's terminal edges. Each routing template also specifies a set of constraints on routing of an unspecified number of conductors that are to be routed between the corridor's terminal edges. To direct the tool to create a routing plan for a particular set of conductors in a particular routing space, the user selects one of the routing templates and modifies the routing template if necessary to adjust the specified shape of the corridor to match that of the particular routing space or to adjust its specified routing constraints if necessary to accommodate any particular routing constraints to be imposed on that set of conductors. The routing tool then processes the modified routing template to generate the routing plan for routing the set of conductors between the terminal edges of the specified corridor in a manner that satisfies the specified routing constraints.

20 Claims, 5 Drawing Sheets

TEMPLATE-BASED GATEWAY MODEL ROUTING SYSTEM

CROSS REFERENCE TO RELATED APPLICATIONS

This application claims benefit of U.S. Provisional Application 60/813,304 entitled "Gateway Model Routing Scheme", filed Jun. 12, 2006.

BACKGROUND OF THE INVENTION

1. Field of the Invention

The invention relates in general to computer-based systems for routing conductors through corridors on planar surfaces and in particular to a method for generating routing plans based on routing templates specifying corridor shapes and routing constraints.

2. Description of Related Art

Referring to FIG. 1, designers commonly use computer-based routing tools to develop plans for routing conductors 1 between terminal edges 2 of devices 3 formed on planar surfaces such as for example liquid crystal display (LCD) panels and organic light emitting diode (OLED) panels. Prior art routing tools automatically route conductors 1 after a user specifies an area 4 in which the conductors are to be routed, specifies positions of each object within the area forming a routing blockage 5, and specifies various constraints on the conductors 1 at terminal edges 2 including constraints on connection locations, minimum wire widths, minimum spacing of the nets conductors at the terminal edges 2, constraints on whether a connector end must be perpendicular to the terminal edge 2, and other constraints.

A designer will often want a routing plan to satisfy various constraints not just on the position and shape of the conductors at terminal edges 2 but also on the shape and path of each conductor between terminal edges 2. As shown in FIG. 2, to exercise more detailed control over conductor routing, the user can partition the conductors 1 into successive sections that are to extend between a series of user-defined "pseudo-terminal edges" 6 and direct the tool to route the conductors between pseudo-terminal edges 2 on a section-by-section basis. However it can be difficult and time-consuming for a designer to provide a routing tool with all of the information needed to define each routing project each time the user has a new routing project, particularly when the user must define numerous pseudo-terminal edges in order to gain detailed control over routing.

In some projects a designer may want all conductors 1 to have equal resistance. Referring again to FIG. 1, when an equal-resistance option is selected, a routing tool will make all conductors 1 routed between terminal edges 2 have equal resistance by adjusting the relative widths of conductors 1, making longer conductors wider than shorter ones. But if a user creates pseudo terminals 6 as illustrated in FIG. 2, the user must sum the conductor section resistances for each conductor 1 manually and make sure that every conductor will sum up to a same resistance value, a tedious and error-prone process.

It is not always easy for a user to modify a routing plan to accommodate a change in requirements. For example, referring to FIG. 2, it can be difficult and time-consuming for designer to reposition pseudo-gates 6 to accommodate a change in the position of one or more blockages 5.

What is needed is an automated routing system that allows more detailed user-control over conductor routing than prior art systems and which makes it relatively easy for a user to modify a routing plan created for one project for another project having somewhat different routing requirements.

SUMMARY OF THE INVENTION

The invention relates to a computer-based tool useful for generating a plan for routing conductors between terminal edges of corridors on planar circuit panels. The invention can be implemented in the form of computer-readable media which, when read and executed by a computer, causes the computer to generate a routing plan in response to user input describing the corridor and various constraints on conductor routing within the corridor.

A routing tool in accordance with the invention allows a user to create a set of routing templates, each specifying the shape of a routing corridor that can accommodate an unspecified number of conductors. Each routing template identifies the corridor's terminal edges and specifies a set of "gateways" sectioning the corridor into a set of tiles. Each routing template also specifies various constraints on how conductors may be routed through each tile and across each terminal edge or gateway including for example, constraints on conductor width, spacing, distribution, routing style and resistance.

To direct the routing tool to create a routing plan for a particular set of conductors through a particular corridor, the user selects one of the routing templates and modifies it if necessary to adjust the specified shape of the corridor so that it matches the shape of the particular corridor or to adjust various routing constraints specified by the template. The routing tool then processes the modified routing template to generate a routing plan for a particular number of conductors that satisfies all routing constraints.

The modified template is stored with the routing plan so that if the user subsequently wishes to modify that routing plan to accommodate a change in corridor shape or in routing constraint, the user need only further modify the template and direct the routing tool to create a new routing plan based on the further modified template.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The invention relates to software or firmware residing on computer-readable media including but not limited to compact disks, hard disks, floppy discs, read only and random access memories. When read and executed by a conventional computer, the software causes the computer to act as a tool for generating a routing plan for conductors conveying signals between structures formed on a planar surface such as for example an organic light emitting diode (OLED) panel or a liquid crystal display (LCD) panel. Although a preferred embodiment of the invention is described in detail below, those of skill in the art will appreciate that other embodiments of the invention need not include all of the features of the preferred embodiment described below. The true scope and spirit of the invention is defined by the claims appended to this specification

1. Template-Based Routing

A computer-based routing tool in accordance with the invention enables a user to create and store a set of adjustable routing templates. Each template includes a set of corridor parameter values defining a planar routing space (a "corridor") through which an unspecified number of conductors may be routed. Each template also includes a set of routing constraint parameter values for controlling various attributes of conductors that may be routed through the corridor. To create a plan for routing a particular set of conductors through a particular corridor, for example on an OLED panel, the user selects one of the routing templates and edits the templates parameters if necessary to adjust the shape of its defined routing corridor to match the shape of the available corridor in the OLED panel, or to alter one or more of the routing constraints imposed by the template. The user then directs the routing tool to automatically generate a plan for routing that particular number of conductors through the corridor on the OLED panel in a manner that satisfies the routing constraints imposed by the selected routing template.

2. Corridor Parameters

Figure 1:
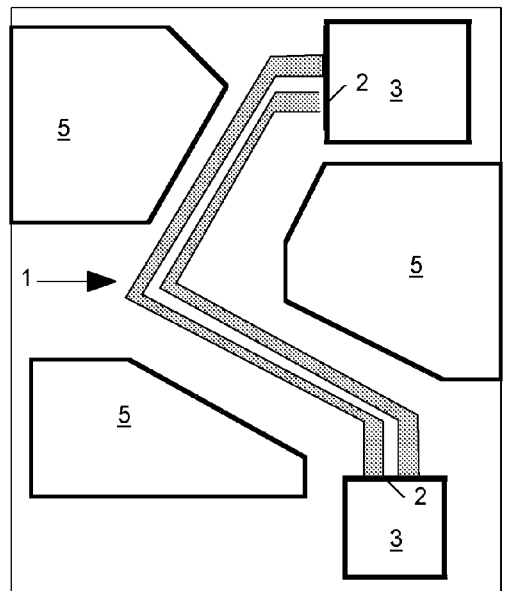
FIGS. 1 and 2 are plan views of a circuit panel showing how a prior art routing tool might route conductors on the circuit panel.
Figure 2:
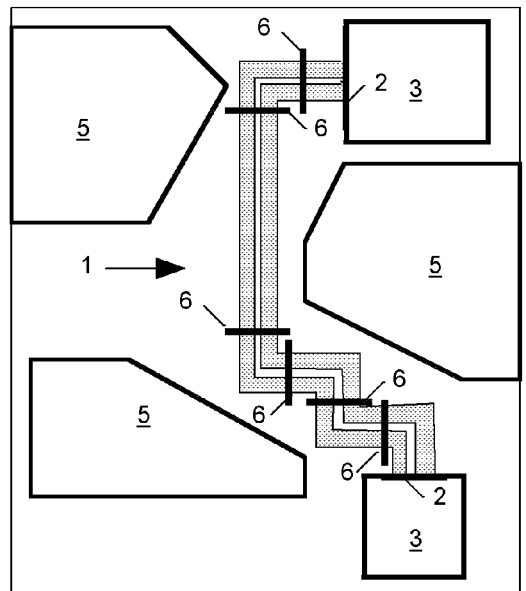
Figure 3:
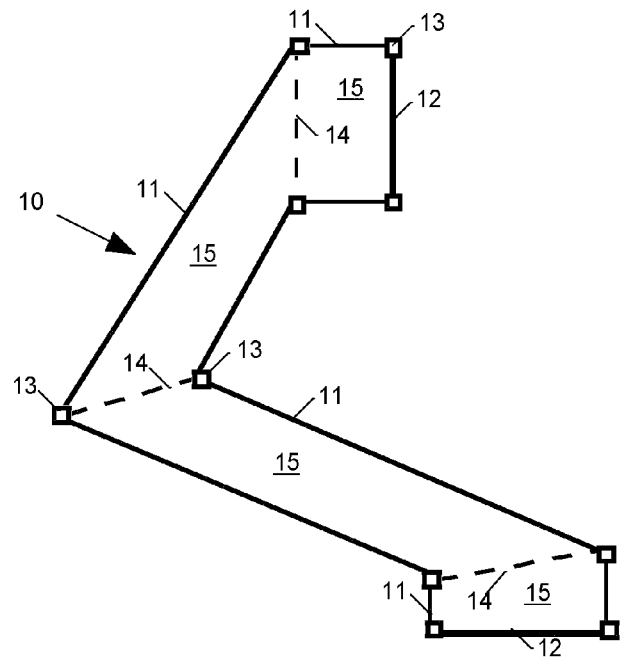
FIG. 3 is a plan view of a corridor defined by a routing template in accordance with the invention.
Figure 4:
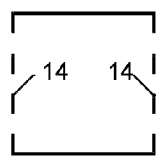
FIGS. 4-13 are plan views of example tiles forming parts of corridors defined by a routing template in accordance with the invention.
Figure 5:
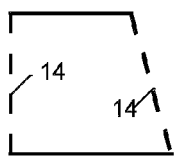
Figure 6:
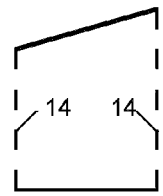
Figure 7:
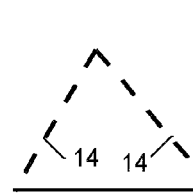
Figure 8:
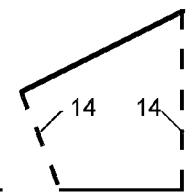
Figure 9:
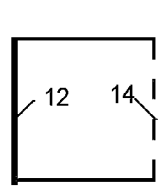
Figure 10:
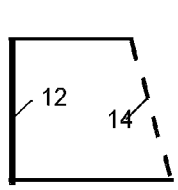
Figure 11:
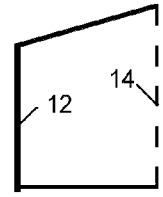
Figure 12:
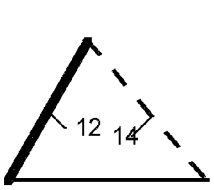

FIG. 3 depicts an example corridor 10 as might be defined by the corridor parameter values included in a routing template. A corridor is a polygon having three or more straight edges, and can be a regular polygon in which all edges are parallel or orthogonal to one another or, as in the example of FIG. 3, an irregular polygon having one or more edges not parallel or orthogonal to one another. The corridor parameter values indicate the coordinates of the corridor's vertices 13, and indicate which vertices are connected by the corridor's boundary edges 11 and or by its terminal edges 12, which together define the shape of the corridor. In a routing plan based on the template, ends of conductors routed through corridor 10 terminate on terminal edges 12 and are normally constrained to the area bounded by the boundary edges 11. The example corridor 10 of FIG. 3 has eight boundary edges 11 and two terminal edges 12. A template must designate at least two edges of the corridor as terminal edges 12.

Figure 13:
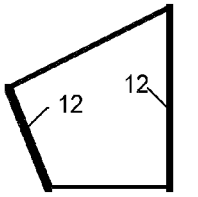

The corridor parameter values may also define one or more "gateways" 14, each extending across corridor 10 between a pair of vertices 13 such that the gateways partition the corridor into a set of tiles 15. In the example of FIG. 3, corridor 10 includes three gateways 14 dividing the corridor into four tiles 15. Tiles may have either three or four sides as illustrated, for example in FIGS. 4-13, and depending on its position within a corridor, two of a tile's sides must be either gateways 14 (FIGS. 4-8), a terminal edge 12 and a gateway 14 (FIGS. 9-12), or two terminal edges 12 (FIG. 13). A tile will have two terminal edges only when it forms a single-tile corridor.

Figures 14, 15, 16:
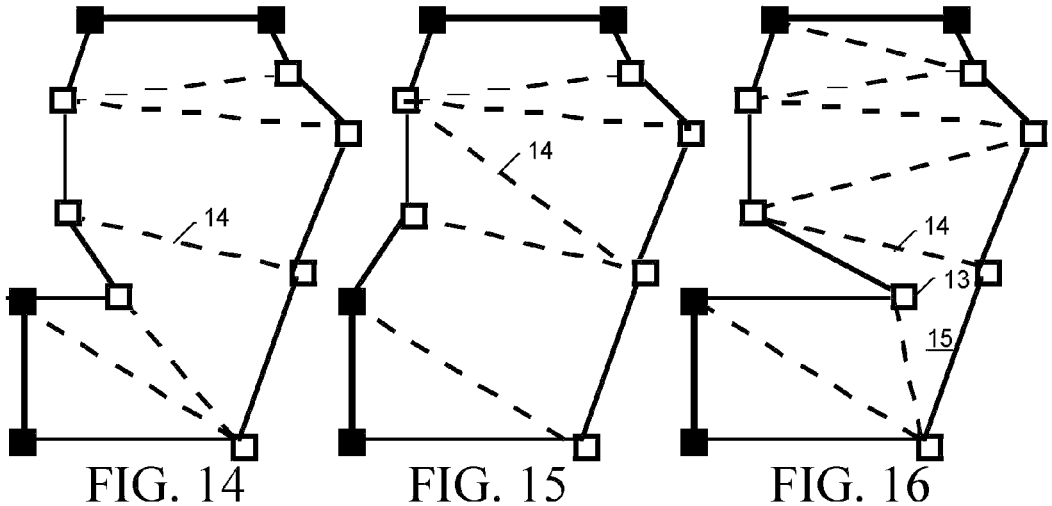
FIGS. 14-18 are plan views of correctly and incorrectly defined corridors.
Figures 17, 18:
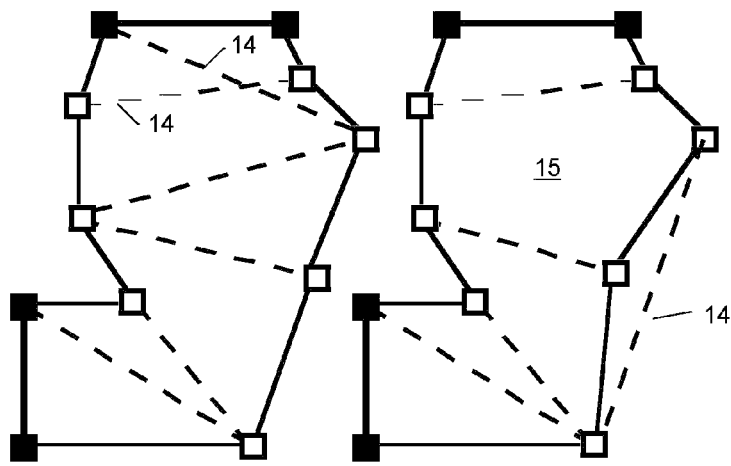

When positioning gateways 14, the template designer should ensure that no tile has more than four sides, that gateways do not intersect one another, that all gateways reside within the corridor boundaries, that at least one gateway is connected to each vertex of the corridor, and that none of the tiles are concave. FIGS. 14-18 illustrated corridors having similar outlines, but having different gateway assignments. FIGS. 14 and 15 depict corridors having correctly assigned gateways while FIGS. 16-18 show incorrectly assigned gateways. The gateway definition of FIG. 16 is incorrect because one of the tiles 15 resulting from the gateway definition is concave. The gateway assignment of FIG. 17 is incorrect because two gateways 14 cross one another, and the gateway assignment of FIG. 18 is incorrect because a gateway 14 extends outside the corridor boundaries and because one of the tiles 15 has more than four sides.

In the preferred embodiment of the invention, a user may define the corridor parameter values for a template using a graphics interface allowing the user to draw each boundary edge 11, each terminal edge 12 and each gateway 14. Alternatively the user may draw the terminal edges 12 and gateways 14, and allow the graphics interface to automatically draw the boundary edges 11. Using a text-based interface, a user could, for example, define a corridor by specifying coordinates of all vertices and indicating which vertices form endpoints of each boundary edge 11, terminal edge 12 and gateway 14.

3. Routing Constraint Parameters

Gateway and Terminal End Attributes

Although a template defines the shape of a corridor, it does not specify the number of conductors to be routed through the corridor and does not specify the path or shape of any conductor routed through the corridor. Each template does, however, include various routing constraint parameter values acting as constraints on how the routing tool may shape and position conductors within the corridor when using the template as a guide for generating a routing plan in an application where a particular number of conductors are to be routed through a planar routing space having the same size and shape as the corridor.

A corridor defined by a template includes one or more tiles, and each conductor routed through the corridor passes through one or more of those tiles. We refer to the section of a conductor within a single tile as a "pipe". The routing tool determines the number of pipes in each tile of a corridor based on the design requirements for the particular routing project, but it determines the shape and position of each pipe relative to the corridor so as to satisfy constraints imposed by user-specified routing constraint parameter values included in the routing template.

Each end of each pipe within a tile terminates either on a gateway or on a corridor terminal edge. A segment of a terminal edge on which a pipe within a tile terminates is called a "tooth", and a segment of a gateway on which a pipe terminates is called a "connector". When the routing tool routes a pipe through a tile, each end of the pipe must terminate on a separate tooth or connector and must have the same width as the tooth or connector. By providing routing constraint parameter values controlling the width, spacing and distribution of the teeth and connectors along the corridor's gateways and terminal edges, a template can control the width, spacing and position of the ends of each pipe the routing tool routes though the corridor.

The template may include a separate "minimum width" attribute parameter for each terminal edge or gateway indicating the minimum width of each tooth or connector along that particular terminal edge or gateway. When the minimum width parameter attribute value is specified for a given terminal edge or gateway, the routing tool must make each pipe terminating on a tooth or connector on that edge or gateway no narrower than the specified width. A template may also include a separate "minimal spacing" attribute parameter for each terminal edge or gateway specifying a minimum allowable spacing between adjacent teeth or connectors along that particular terminal edge or gateway. When the minimum spacing parameter attribute value is specified for a given terminal edge or gateway, the routing tool must space adjacent pipes terminating on a pair of teeth or connectors on that edge or gateway no closer than the specified minimal spacing.

The template does not specify the total number of teeth or connectors along gateway or terminal edge but the value of an "alignment attribute" parameter for each gateway or terminal edge of a tile indicates how the routing tool is to distribute teeth or connectors along that terminal edge or gateway once the number of teeth or connectors are known. The alignment attribute parameter value for each gateway or terminal edge selects from among several different types of alignment styles as illustrated, for example in FIGS. 19-22.

Figure 19:
FIGS. 19-22 are sectional elevation views of conductors routed across gateways of a corridor in accordance with routing constraints imposed by a routing template.

In a "distributed" alignment style as illustrated in FIG. 19, teeth or connectors 23 are evenly distributed along the terminal edge 12 or gateway 14. For illustrative purposes edges 12, 14 and teeth or connectors 23 are shown as two-dimensional objects, but they are actually of only a single dimension.

Figure 20:

In a "centered" alignment style, as illustrated in FIG. 20, the teeth or connectors 23 are centered along the terminal edge 12 or gateway 14 with a uniform spacing between teeth or connectors 23 controlled by a separate spacing parameter value for each gateway or terminal edge.

Figure 21:

In a "left" alignment, as illustrated in FIG. 21, starting from the left hand side, the teeth or connectors 23 are distributed along the terminal edge 12 or gateway 14 with uniform spacing controlled by the spacing parameter value.

Figure 22:

In a "right" alignment, as illustrated in FIG. 22, starting from the right hand side, the teeth or connectors 23 are distributed along the terminal edge 12 or gateway 14 with uniform spacing controlled by the spacing parameter value.

Although the preferred embodiment of the invention permits the four alignment styles illustrated in FIGS. 19-22, those of skill in the art will appreciate that other alignment styles are possible.

The form designer need select the minimum width, minimum spacing, and alignment attributes for any given terminal edge 12 or gateway 14 only if the designer wants to directly control the width, spacing and distribution of pipe ends terminating on that gateway or terminal edge. If the form designer does not select the width, spacing, and or alignment attributes for a particular terminal edge or gateway 14, then the routing tool is free to choose pipe width, spacing and distribution at the terminal edge or gateway based on other considerations as discussed below. For example, the routing tool may set the width and alignment of terminal edge teeth to match the width and alignment of the device terminals the connectors routed through a corridor are to interconnect.

Edge Attributes

Figure 25:
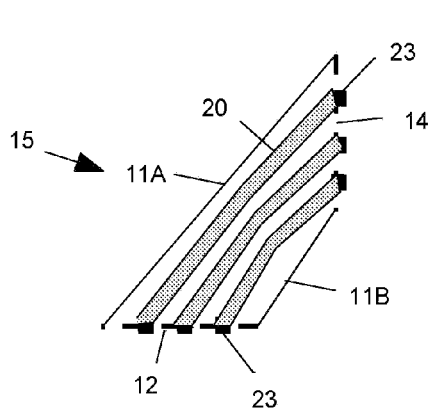
Figure 26:
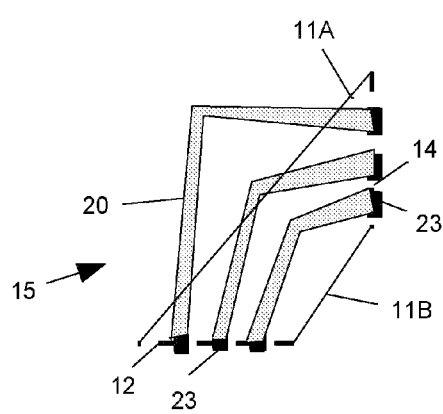

Each template includes a designer-specified value of an "edge attribute" routing constraint parameter associated with each boundary edge 11 of each tile to indicate whether it is a "hard edge" or a "soft edge". The routing tool is prohibited from routing any conductor across a hard edge but is permitted to route a conductor across a soft edge. FIG. 25 shows a tile 15 bounded by a gateway 14, a terminal edge 12 and boundary edges 11A and 11B wherein the template has designated boundary edges 11A and 11B as hard edges. Thus when the routing tool generates a routing plan for pipes 20 extending between gateway 14 and terminal edge 12, it does not permit any of pipes 20 to cross either boundary edge 11A or 11B. FIG. 26 shows a similar tile 15 wherein the template designated boundary edge 11A as a soft edge. Thus when the routing tool generates a routing plan for pipes 20, it is free to allow some of the conductors to cross boundary edge 11A as shown in FIG. 26.

Tile Attributes

Figure 23:
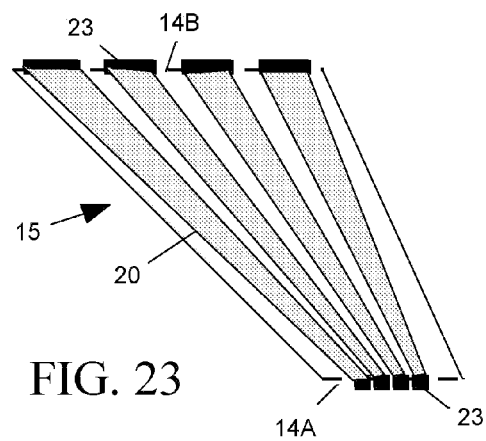
FIGS. 23-28 are plan views of conductors routed though corridor tiles in accordance with various routing constraints imposed by a routing template.
Figure 24:
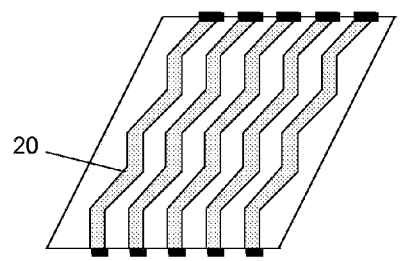

A template also selects a value of "path" attribute parameter for each tile to indicate whether the routing tool must route each pipe within the tile in a straight path between its endpoints or whether it may route pipes along jogged paths. FIGS. 23 and 24 show a tile 15 in which a set of four pipes 20 are arranged along a gateway 14A with centered alignment and are arranged along another gateway 14B with distributed alignment. When a template sets the path attribute parameter associated with a tile for straight path routing, the routing tool will route all pipes 20 in straight lines between the tile's gateways or terminal edges as illustrated in FIG. 23. A template may set a tile's path attribute parameter to permit multiply jogged ("zigzagged") routing of conductors 20 as illustrated in FIG. 24 or singly-jogged routing of conductors 20 as illustrated in FIGS. 25 and 26. Those of skill in the art will appreciate that the path attribute parameter value may constrain routing within a tile to other routing styles such as for example routing styles in which pipes may follow curved paths.

A form designer can set a "minimum pipe spacing" parameter value for each tile to indicate a required minimum space between pipes within that tile that can be larger than the minimum spacing required by the design rules for the panel technology to be used. If the minimum pipe spacing parameter value is not set for a tile, the layout tool need satisfy only the minimum pipe spacing constraint specified by the design.

The form designer can set a "minimum pipe width" parameter value for each tile to indicate a required minimum width of each pipe within that tile that can be larger than the minimum pipe width required by the design rules for the panel technology to be used. If the minimum pipe width parameter value is not set for a tile, the layout tool need satisfy only the minimum pipe width constraint specified by the design.

Figure 27:
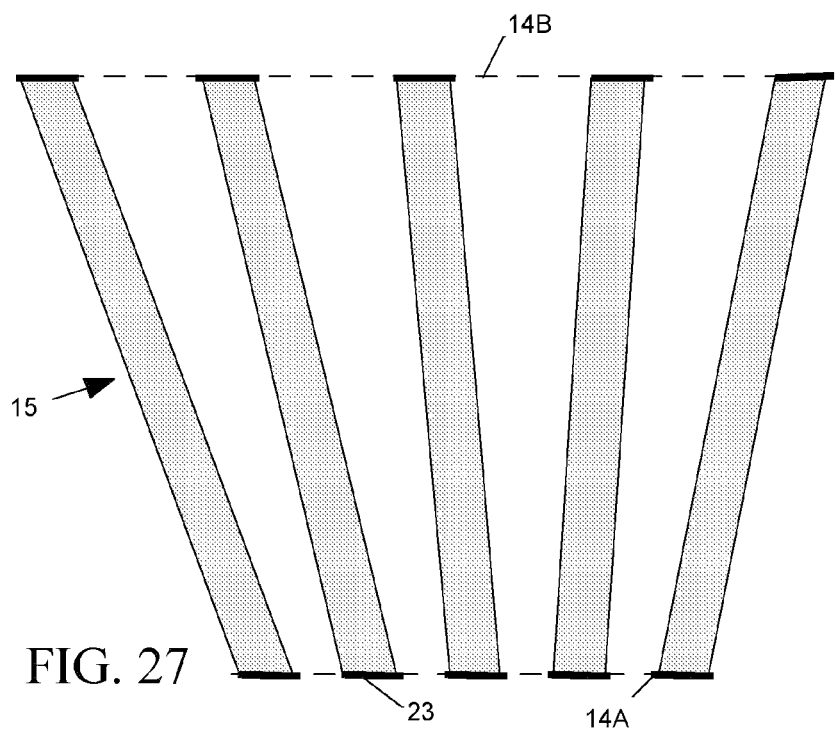

The form designer can set a "uniform width" routing constraint parameter value for any given tile true to require the routing tool to make all pipes within the tile of a uniform width. For example FIG. 27 shows a tile 15 in which a set of pipes 20 extending between gateways 14A and 14B are subject to a uniform width constraint. When neither of the gateways or terminal edges has a specified tooth width, the uniform width for each pipe is controlled by the minimum pipe width parameter value the form designer may assign to the tile. If the pipe width parameter value for the tile is unassigned, then the routing tool selects a uniform pipe width consistent with general design rules.

When generating a layout, the routing tool will normally try to minimize the total path resistance of each pipe while satisfying all user-specified constraints in the template and all design rule constraints associated with the technology to be used to fabricate the panel. Each template, however, also includes a separate "uniform resistance" flag for each tile, and when the template designer sets the uniform resistance flag true for any one or more of the tiles, the routing tool will increase or decrease the resistance of selected pipes within those particular tiles as necessary to minimize variation in resistances of all conductors throughout the entire corridor Accordingly, the routing tool carries out the routing process in two steps. It first designs the pipes in every tile for maximum width and minimum allowable spacing to the extent possible while satisfying all routing constraints other than the uniform resistance constraint, which the tool initially ignores. By maximizing the width of each pipe, the tool initially designs each conductor for minimum possible resistance. Thereafter, if the template designer has set the uniform resistance flags for one or more of the tiles true, the routing tool tries to minimize the resistance deviation among all conductors within the entire corridor by appropriately adjusting the lengths and/or widths of selected pipes, but only within those tiles for which the uniform resistance flag has been set true. The tool can increase or decrease the length of a pipe to lower its resistance variation by adding or removing zigzags in its path.

Figure 28:
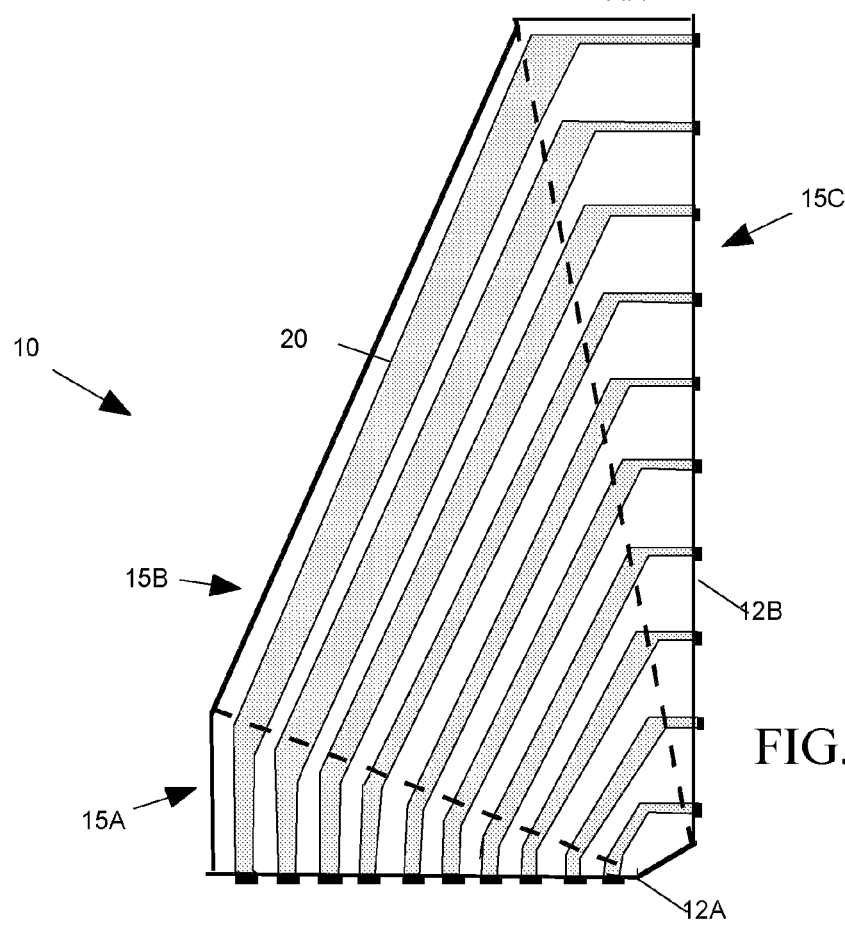

FIG. 28 shows a corridor 10 having three tiles 15A, 15B and 15C. In this example, the uniform resistance flag was set true only for tile 15B and template constrained pipes within tile 15B to following straight paths. Thus the routing tool could minimize variation in total resistances of all conductors 20 between the corridor's terminal edges 12A and 12B only by adjusting widths of the pipes within tile 15B.

4. Template and Layout Editors

Figure 29:
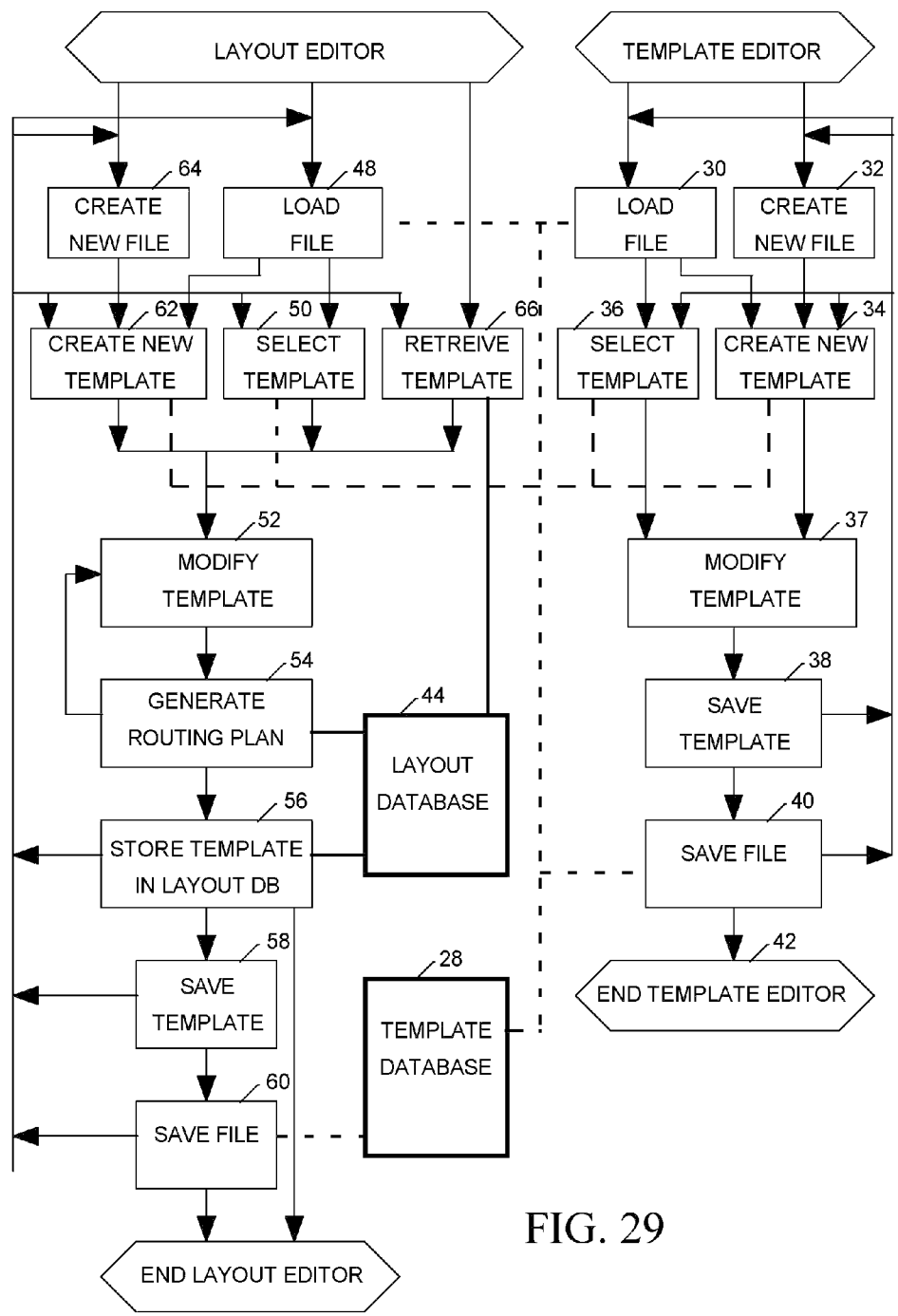
FIG. 29 is a dataflow diagram illustrating a method carried out by a routing tool in accordance with a preferred embodiment of the invention

FIG. 29 is a dataflow diagram illustrating a method carried out by a routing tool in accordance with a preferred embodiment of the invention. The routing tool provides a user with a template editor for helping the user create and modify routing templates and with a layout editor for helping the user create and modify routing plans for specific applications based on those routing templates.

The routing tool stores routing templates in a template database 28 and stores routing plans for various projects in a layout database 44. Template database 28 organizes templates into a set of files, each containing one or more templates. In addition to storing routing plans for specific projects, layout database 44 stores user-supplied information that is specific to each layout project including the names and number of conductors to be routed through each available routing space, a copy of the template it used to create each routing plan for that layout project, and a description of all routing design rules that apply to the project including, for example, rules specifying minimum conductor widths and spacing, In using the template editor to modify a template residing in an existing file, the user loads the file containing the template into the template editor (step 30) and then selects the template to be modified (step 36). To create a new template for an existing file, the user loads the file into the template editor (step 30) and commands the editor to create a new template of a user-supplied name (step 34) within that file, wherein all corridor and routing constraint parameters are set to default values. To create a new template in a new file, the user commands the template editor to create a new file with a user-supplied name (step 32) and to create the new template within that file at step 34.

Once the user has created a new template or selected an existing template at step 34 or 36, the user can modify the template at step 37 by altering its corridor parameter values to adjust the shape of the corridor defined by the template or by altering its routing constraint parameter values. Thereafter the user can direct the editor to save the modified template in the file (step 38) and then save the file in template database 28 (step 40). After saving the template at step 38, the user can return to step 34 or 36 to create or select another template for that file. After saving the file at step 40, the user can return to step 30 or 32 to load or create another file. Otherwise the user can terminate the template editor (step 42) after saving the last modified template at step 38 and saving the file containing it at step 40.

The layout editor generates routing plans based on routing templates. To create a new routing plan for a specific project based on an existing template in template database 28, the user loads the file in template database 28 (step 48) containing the template into the layout editor and selects the template from the file (step 50). The user can then modify the template if necessary to meet requirements of the specific project, for example by changing the shape of the corridor or altering various routing constraints imposed by the template (step 52). The user then directs the layout editor to generate a routing plan based on the template (step 54). As it generates the routing layout, the layout editor checks for design rule violations and modifies the layout to correct any design rule violations when possible to do so without departing from any layout constraints imposed by the template. The editor reports all uncorrectable design rule violations to the user so that the user can return to step 52 to modify the template to eliminate design rule conflicts.

When template database 28 does not contain a suitable template for a particular layout project, the user can add a new template at step 62 to that file and modify the new template at step 52 so that the layout editor can use it as a basis for the routing plan generated at step 54. The user can alternatively create a new file at step 64, and a new template for that file at step 62 using the layout editor.

Having successfully generated a new or modified routing plan at step 54, the layout editor stores the routing plan along with a copy of the template used to create the routing plan in layout database 44 (step 56). The user can then direct the layout editor to save the template in the currently selected file (step 58) and then save the file in template database 28 (step 60). Alternatively, after step 56, 58 or 60 the user can return to one of steps 48, 50, 62, 64 or 66 to begin another routing project.

The user can later modify an existing routing plan stored in layout database 44 by directing the layout editor to retrieve the template upon which the layout was based from layout database 44 (step 66), modifying the template (step 52), and then directing the layout editor to generate a new routing plan based on the modified template (step 54).

Thus has been shown and described a computer-based routing system that creates a routing plan for routing conductors through a corridor based on a user-created template describing the shape of the corridor, specifying a set of gateways segmenting the corridor into tiles, and specifying various constraints on routing of conductors though each tile and across each gateway. By basing the routing plans on templates, the routing system makes it easy for a user to create and modify routing plans even when corridors are irregularly shaped and when routing constraints vary from one section of a corridor to another.

The invention claimed is:

1. A computer-readable storage device containing software which, when read and executed by a computer that receives user input specifying a number of conductors to be routed so that they extend between a set of terminal edges on a planar surface, causes the computer to generate a routing plan for routing a set of the specified number of conductors so that they extend between said set of terminal edges on the planar surface, by a method that comprises the steps of:

a. creating a routing template comprising corridor parameter values specifying a shape of a corridor on the planar surface bounded by the terminal edges and at least one boundary edge, and routing constraint parameter values specifying constraints on routing of an unspecified number of conductors through the corridor between the terminal edges; and b. processing the routing template to generate the routing plan for routing the set of conductors through the corridor, wherein the routing plan establishes routes for the set of conductors that satisfy the constraints imposed by the routing constraint parameter values.

2. The computer-readable storage device in accordance with claim 1 wherein the routing constraint parameter values include a separate edge attribute value corresponding to each boundary edge of the corridor and indicating whether that boundary edge is a hard edge that conductors routed between the terminal edges may not cross, or is a soft edge that conductors routed between the terminal edges may cross.

3. The computer-readable storage device in accordance with claim 1 wherein the corridor parameter values also specify at least one gateway extending across the corridor, such that the at least one gateway segments the corridor into a set of tiles.

4. The computer-readable storage device in accordance with claim 3 wherein the template includes a separate routing constraint parameter value associated with each gateway specifying a minimum width of each conductor of the set of conductors where it crosses the gateway.

5. The computer-readable storage device in accordance with claim 3 wherein the template includes a separate routing constraint parameter value associated with each gateway specifying a minimum spacing between conductors of the set of conductors where they cross the gateway.

6. The computer-readable storage device in accordance with claim 3 wherein the template includes a separate routing constraint parameter value associated with each gateway that is an alignment parameter value specifying how the set of conductors are to be distributed where they cross the gateway.

7. The computer-readable storage device in accordance with claim 6 wherein the alignment parameter value associated with each gateway is selected from the following:

a centered alignment parameter value indicating that conductors crossing the gateway are to be distributed about a center of the gateway with a specified spacing between conductors where they cross the gateway, a right alignment parameter value indicating that conductors crossing the gateway are to be evenly distributed nearest a right side of the gateway with the specified spacing between conductors where they cross the gateway, a left alignment parameter value indicating that conductors crossing the gateway are to be evenly distributed nearest a left side of the gateway with the specified spacing between conductors where they cross the gateway, and a distributed alignment parameter value indicating that conductors crossing the gateway are to be evenly distributed over the gateway with maximum available spacing between conductors where they cross the gateway.

8. The computer-readable storage device in accordance with claim 3 wherein a separate one of the routing constraint parameter values associated with each tile indicates whether conductors routed within the tile must follow straight paths or may follow other than straight paths though the tile.

9. The computer-readable storage device in accordance with claim 3 wherein the routing constraint parameter values corresponding to each tile indicate whether conductors routed through the tile must be of uniform width or may be of variable width within the tile.

10. The computer-readable storage device in accordance with claim 3 wherein the routing constraint parameter values include a separate uniform resistance parameter value associated with each tile indicating whether resistances of portions of conductors within that tile are to be adjusted to minimize variation in total resistance of all conductors routed through the corridor between their endpoints within the corridor.

11. The computer-readable storage device in accordance with claim 7 wherein the routing constraint parameter values corresponding to each tile indicates whether conductors routed through the tile must be of uniform width or may be of variable width within the tile.

12. The computer-readable storage device in accordance with claim 11 wherein the routing constraint parameter values include an equal resistance parameter value indicating whether all conductors routed through the corridor must be of equal resistance between their endpoints within the corridor.

13. The computer-readable storage device in accordance with claim 12 wherein the routing constraint parameter values include a separate edge attribute value corresponding to each boundary edge of the corridor and indicating whether that boundary edge is a hard edge that conductors routed between the terminal edges may not cross, or is a soft edge that conductors routed between the terminal edges may cross.

14. The computer-readable storage device in accordance with claim 1 wherein the method further comprises the step of c. storing the routing template in a template database containing a plurality of other routing templates; and wherein step b comprises the substeps of:

b1. reading the routing template out of the template database;

b2. modifying the routing template by altering at least one of its corridor parameters values and constraint parameter values thereby to generate a modified routing template, and b3. processing the modified routing template to generate the routing plan.

15. The computer-readable storage device in accordance with claim 14, wherein step b further comprises the substeps of:

b4. storing the routing plan in a layout database; and b5. storing the modified routing template in the layout database, wherein the layout database associates the routing plan with the modified routing template.

16. The computer-readable storage device in accordance with claim 1 wherein step b further comprises the substeps of:

b1. reading the modified routing template out of the layout database;

b2. further modifying the modified routing template by altering at least one of its corridor parameter values and constraint parameter values, thereby to produce a further modified routing template, and b3. processing the further modified template to generate a modified version of the routing plan.

17. The computer-readable storage device in accordance with claim 3 wherein step a comprises the substeps of:
- a1. receiving information indicating relative positions of the terminal edges, the at least one boundary edge, and the at least one gateway, and
- a2. generating the corridor parameter values in accordance with the information received at step a1.

18. The computer-readable storage device in accordance with claim 3 wherein step a comprises the substeps of:
- a1. receiving information indicating relative positions of the terminal edges and the at least one gateway, and
- a2. determining a relative position of the at least one boundary edge in response to the information receive at step a1, and
- a3. generating the corridor parameter values in accordance with the information received at step a1 and the determined relative position of the at least one boundary edge.

19. The computer-readable storage device in accordance with claim 1 wherein the template includes a separate routing constraint parameter value associated with each tile specifying a minimum width of each conductor of the set of conductors within that tile.

20. The computer-readable storage device in accordance with claim 1 wherein the template includes a separate routing constraint parameter value associated with each tile specifying a minimum spacing between conductors of the set of conductors within that tile.

* * * * *